US008535065B2

(12) United States Patent
Costello et al.

(10) Patent No.: US 8,535,065 B2
(45) Date of Patent: Sep. 17, 2013

(54) CONNECTOR ASSEMBLY FOR INTERCONNECTING ELECTRICAL CONNECTORS HAVING DIFFERENT ORIENTATIONS

(75) Inventors: Brian Patrick Costello, Scotts Valley, CA (US); Justin Shane McClellan, Camp Hill, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 75 days.

(21) Appl. No.: 13/345,859

(22) Filed: Jan. 9, 2012

(65) Prior Publication Data

US 2013/0178107 A1 Jul. 11, 2013

(51) Int. Cl.
*H01R 12/00* (2006.01)
*H05K 1/00* (2006.01)

(52) U.S. Cl.
USPC ............................ 439/65; 439/82; 439/607.03

(58) Field of Classification Search
USPC .................. 439/628, 607.03, 607.04, 607.05, 439/607.06, 607.07, 607.09, 607.23, 82, 439/591, 544, 65
See application file for complete search history.

(56) References Cited

U.S. PATENT DOCUMENTS

| | | | | |
|---|---|---|---|---|
| 7,108,556 | B2 * | 9/2006 | Cohen et al. | 439/607.08 |
| 7,744,415 | B2 | 6/2010 | Cohen et al. | |
| 7,758,385 | B2 * | 7/2010 | Davis et al. | 439/626 |
| 8,047,874 | B2 * | 11/2011 | Ito | 439/607.1 |
| 2007/0021000 | A1 * | 1/2007 | Laurx | 439/608 |
| 2008/0045079 | A1 * | 2/2008 | Minich et al. | 439/544 |

* cited by examiner

*Primary Examiner* — Hae Moon Hyeon

(57) ABSTRACT

An electrical connector assembly including an electrical connector that has a connector body with mating and interior sides facing in opposite directions. The electrical connector also includes electrical contacts that are held by the connector body. The connector assembly also includes an interposer having a connector side, an opposite board side, and plated vias that extend into the interposer from at least one of the connector or board sides. The connector side engages the interior side of the electrical connector. The electrical contacts of the electrical connector are electrically coupled to corresponding vias. The connector assembly also includes board contacts that extend from the board side of the interposer and are electrically coupled to corresponding vias. The board contacts are communicatively coupled to the electrical contacts through the interposer.

20 Claims, 6 Drawing Sheets

CONNECTOR ASSEMBLY FOR INTERCONNECTING ELECTRICAL CONNECTORS HAVING DIFFERENT ORIENTATIONS

BACKGROUND OF THE INVENTION

The subject matter described and/or illustrated herein relates generally to an electrical connector assembly that is configured to interconnect connectors that have different orientations with respect to each other.

Some communication systems, such as a blade server system, include a large backplane (or midplane) circuit board, which is generally referred to as a backplane. The system also includes a plurality of card modules (e.g., line cards, server blade cards, switch cards, I/O cards). Some of the card modules may be coupled to a front side of the backplane, and other card modules can be coupled to a back side of the backplane. The card modules coupled to the front side extend parallel to each other, but orthogonal to the card modules coupled to the back side of the backplane. For example, the card modules along the front side may extend vertically, and the card modules along the back side may extend horizontally. The front side card modules and the back side card modules are communicatively coupled to one another through the backplane.

In some systems, a pair of header connectors are mounted to the backplane and oppose each other with the backplane between the header connectors. Each header connector has a mating interface that faces away from the backplane and board contacts that are electrically connected to the backplane. Each of the header connectors is configured to engage one of the card modules at the mating interface. For those systems having an orthogonal architecture, the board contacts of each header connector are rotated and/or shaped before engaging the backplane. For example, each differential pair of board contacts may be rotated about 45° before the board contacts connect to the backplane. However, the rotated and/or shaped board contacts may present challenges to signal integrity and electrical performance of the overall system. These challenges become even more difficult when the transmission speed and/or density of the board contacts increases.

Accordingly, there is a need for an electrical connector assembly that interconnects connectors having different orientations relative to each other and that can address at least one of the above challenges.

BRIEF DESCRIPTION OF THE INVENTION

In one embodiment, an electrical connector assembly is provided that includes an electrical connector having a connector body with mating and interior sides facing in opposite directions. The electrical connector also includes electrical contacts that are held by the connector body. The connector assembly also includes an interposer having a connector side, an opposite board side, and plated vias that extend into the interposer from at least one of the connector or board sides. The connector side engages the interior side of the electrical connector. The electrical contacts of the electrical connector are electrically coupled to corresponding vias. The connector assembly also includes board contacts that extend from the board side of the interposer and are electrically coupled to corresponding vias. The electrical contacts are configured to engage a module connector along the mating side, and the board contacts are configured to engage an electrical component along the board side. The board contacts are communicatively coupled to the electrical contacts through the interposer.

In some embodiments, the vias include first vias that extend into the interposer from the connector side and second vias that extend into the interposer from the board side. The interposer also has conductive traces that extend along and electrically couple associated first and second vias. The first vias are electrically coupled to the electrical contacts and the second vias are electrically coupled to the board contacts.

Optionally, the electrical contacts include first signal pairs of electrical contacts, and the board contacts include second signal pairs of board contacts. The first signal pairs are in a first configuration along the mating side, and the second signal pairs are in a second configuration along the board side. The first and second configurations are different.

In another embodiment, an electrical connector assembly is provided that includes an interposer having plated vias and conductive traces that communicatively couple associated vias. The connector assembly also includes a connector body and a contact organizer having the interposer located therebetween. The connector body has a mating side and the contact organizer has a mounting side. The mating and mounting sides face away from the interposer in opposite directions along a mating axis. The connector assembly also includes electrical contacts that are positioned along the mating side of the connector body and that are communicatively coupled to the interposer. The connector assembly also includes board contacts that are positioned along the mounting side of the contact organizer and that are communicatively coupled to the interposer. The board contacts are communicatively coupled to associated electrical contacts through the interposer.

In a further embodiment, a communication system is provided that includes a circuit board having opposite first and second board surfaces. The system also includes first and second electrical connector assemblies that are mounted to the first and second board surfaces, respectively. At least one of the first or second connector assemblies includes an electrical connector and an interposer that is located between the electrical connector and the circuit board. The first and second connector assemblies have mating interfaces with electrical contacts. The mating interfaces of the first and second connector assemblies are configured to engage corresponding module connectors that have an orthogonal relationship with respect to each other.

DETAILED DESCRIPTION OF THE INVENTION

Figure 2:
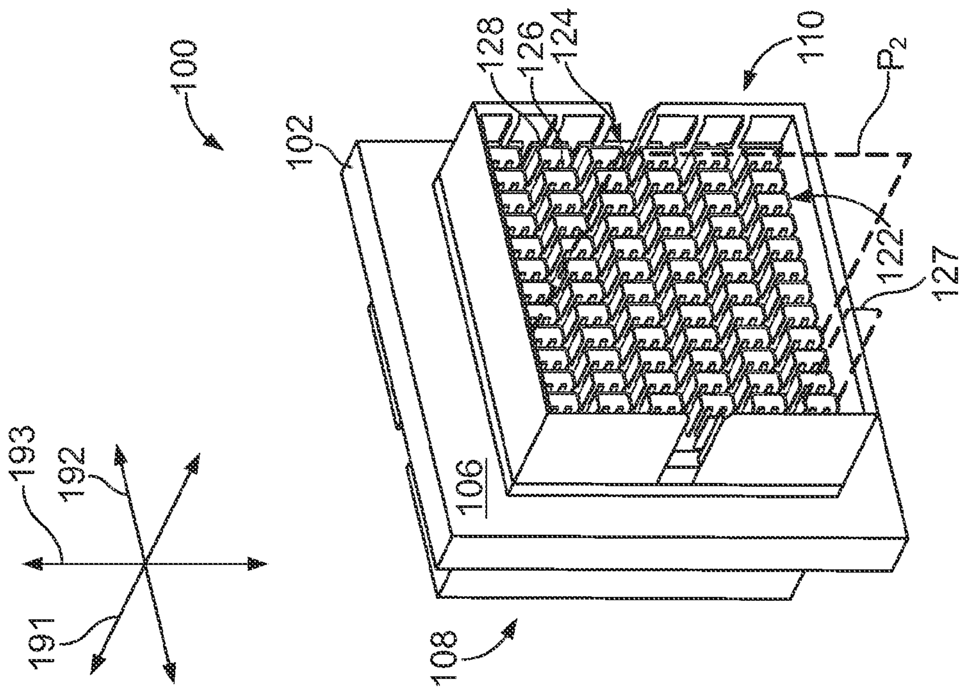
FIG. 2 is a rear perspective view of the portion of the communication system shown in FIG. 1.
Figure 1:
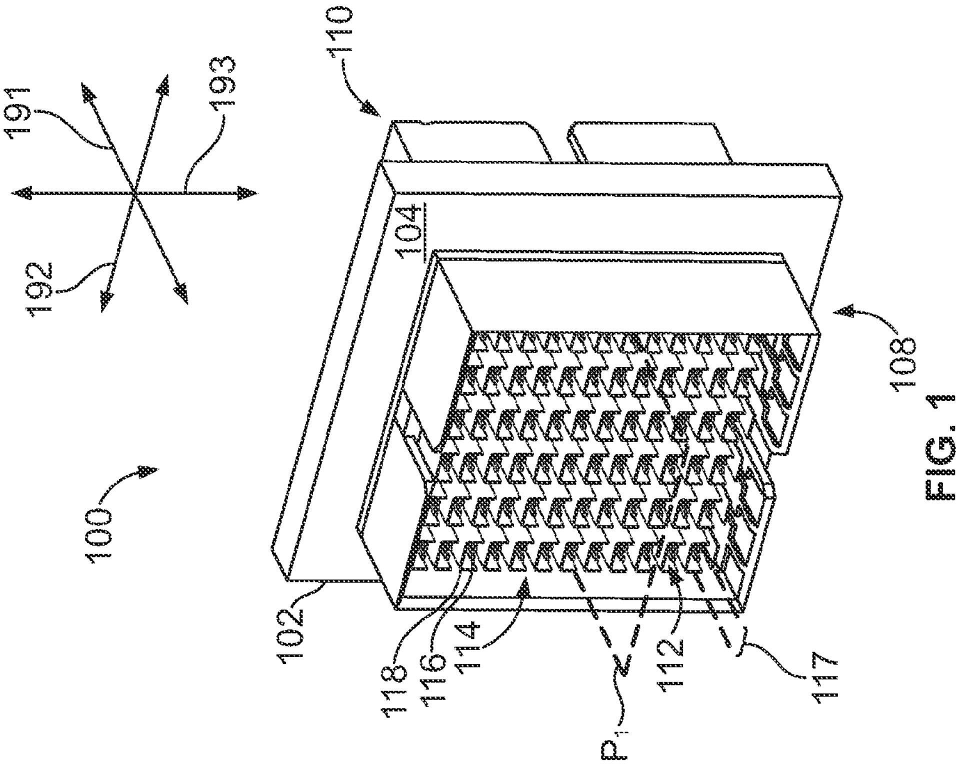
FIG. 1 is a front perspective view of a portion of a communication system having electrical connector assemblies formed in accordance with one embodiment.

FIGS. 1 and 2 are front perspective and rear perspective views, respectively, of a portion of a communication system 100. The system 100 is oriented with respect to mutually perpendicular axes 191-193 including a mating axis 191 and lateral axes 192, 193. As shown, the system 100 includes a circuit board 102 having opposite first and second board surfaces 104 (FIG. 1), 106 (FIG. 2) that extend transverse to the mating axis 191 along a plane that is defined by the lateral axes 192, 193. The board surfaces 104, 106 face in opposite directions along the mating axis 191. The system 100 also includes a first electrical connector assembly 108 and a second electrical connector assembly 110 that are mounted to the first and second board surfaces 104, 106, respectively. The connector assemblies 108, 110 are communicatively coupled to each other through the circuit board 102.

In an exemplary embodiment, the system 100 is a blade server system in which front card modules (not shown), such as removable line cards or server blade cards, are configured to engage the connector assembly 108 and rear card modules (not shown), such as removable switch cards or I/O cards, are configured to engage the connector assembly 110. In such embodiments, the circuit board 102 may be characterized as a backplane or midplane circuit board. However, a blade server system is only one example and embodiments described may be used in other communication systems or environments. For example, the connector assemblies 108, 110, which are described in greater detail below, may be used to connect an electrical connector directly to a circuit board that is not a midplane or backplane circuit board or to another electrical component. Accordingly, embodiments described herein are not limited to blade server systems.

In the illustrated embodiment, the connector assemblies 108, 110 are aligned and directly oppose each other with the circuit board 102 therebetween. However, in other embodiments, the connector assemblies 108, 110 may not be aligned and may have different positions along the board surfaces 104, 106. It is noted that only a portion of the system 100 is shown in FIGS. 1 and 2, which illustrate only one pair of connector assemblies 108, 110. In an exemplary embodiment, the system 100 includes multiple pairs of connector assemblies similar to the connector assemblies 108, 110 that are coupled to the circuit board 102. Such connector assemblies may be arranged in rows and columns along each of the board surfaces 104, 106.

The connector assemblies 108, 110 are configured to engage module connectors (not shown) during loading operations in which the module connectors are advanced in a mating direction along the mating axis 191 and engaged to the connector assemblies 108, 110. Such module connectors may be part of the aforementioned card modules (e.g., removable line cards, server blade cards, and the like) or the module connectors may be other types of connectors, such as a cable connector.

As shown in FIG. 1, the connector assembly 108 includes a mating interface 112 (FIG. 1) having an array of electrical contacts 114. The electrical contacts 114 include signal contacts 116 and ground contacts (or shields) 118. In an exemplary embodiment, the signal contacts 116 are arranged in signal pairs 117 and are configured to transmit differential signals. The ground contacts 118 can be C-shaped shields that are shaped to at least partially surround one of the signal pairs 117. The C-shaped shields open in a direction along the lateral axis 193. However, in other embodiments, the ground contacts 118 may be other types of conductive elements that facilitate shielding the signal contacts 116. For example, the ground contacts 118 may be pin contacts in which a plurality of the pin contacts are arranged around and proximate to each signal contact 116.

As shown in FIG. 2, the connector assembly 110 also includes a mating interface 122 having an array of electrical contacts 124. The electrical contacts 124 include signal contacts 126 and ground contacts (or shields) 128. The signal contacts 126 are arranged in signal pairs 127 and are configured to transmit differential signals. In the illustrated embodiment, the ground contacts 128 are also C-shaped shields shaped to at least partially surround one of the signal pairs 127. The C-shaped shields open in a direction along the lateral axis 192. Accordingly, in the illustrated embodiment, the ground contacts 118 (FIG. 1) are oriented differently than the ground contacts 128.

As shown in FIG. 1, the two signal contacts 116 of each signal pair 117 can extend substantially parallel to each other along a contact plane $P_1$. The mating axis 191 and the lateral axis 192 extend parallel to and define the contact plane $P_1$. With respect to FIG. 2, the two signal contacts 126 of each signal pair 127 extend substantially parallel to each other along a contact plane $P_2$. The mating axis 191 and the lateral axis 193 extend parallel to and define the contact plane $P_2$. As shown by comparing FIGS. 1 and 2, the contact planes $P_1$ and $P_2$ are orthogonal to each other.

The mating interfaces 112, 122 may be different with respect to each other. For example, the mating interfaces 112, 122 have different rotational orientations or positions with respect to each other. As shown in FIGS. 1 and 2, the mating interfaces 112, 122 have an identical contact configuration (or pinout) in which the electrical contacts 114 (FIG. 1) and the electrical contacts 124 (FIG. 2) are of the same types and are arranged identically. Nonetheless, the mating interface 122 is rotated substantially 90° with respect to the mating interface 112. More particularly, the mating interface 122 is rotated substantially 90° with respect to the mating interface 112 when viewing the mating interfaces 112, 122 in a direction along the mating axis 191 with the lateral axis 192 as the horizon.

The mating interfaces 112, 122 can also be different when the contact configurations or pinouts are different. More specifically, the electrical contacts 114 at the mating interface 122 may be arranged differently than the electrical contacts 124 at the mating interface 122. The electrical contacts 114, 124 are arranged differently when at least one of (a) orders of the contacts are different; (b) rotational orientations of associated signal pairs are different; or (c) spacings between the contacts are different. The mating interfaces 112, 122 may also be different with respect to each other when the electrical contacts 112, 124 are not of the same type.

The connector assemblies 108, 110 may use interposers, such as the interposer 132 (FIG. 3), to facilitate transitioning conductive pathways from the mating interface 112 to the mating interface 122. In particular embodiments, the interposers facilitate transitioning between mating interfaces in which the signal pairs of one mating interface are arranged differently than the associated signal pairs of the other mating interface.

For example, as discussed above, the signal pairs 117 and the signal pairs 127 are oriented along different contact planes $P_1$ and $P_2$. The signal pairs 117 and the signal pairs 127 may be arranged in a predetermined grid or array (e.g., rows and columns). As shown in FIG. 1, the mating interface 112 includes multiple rows of the signal pairs 117 in which the two signal contacts 116 of each signal pair 117 in one row extend within a common plane. By way of example, in one row of the signal pairs 117, the two signal contacts 116 of each signal pair 117 in the row are positioned within the contact plane $P_1$. In an exemplary embodiment, each row of signal pairs 117 may extend within a different contact plane that is parallel to the contact plane $P_1$. Such configurations may be referred to as a horizontal contact configuration.

As shown in FIG. 2, the mating interface 122 includes multiple columns of the signal pairs 127 in which the two signal contacts 126 of each signal pair 127 are positioned within a common plane. For example, in one column of the signal pairs 127, the two signal contacts 126 of each signal pair 127 in the column are positioned within the contact plane $P_2$. In an exemplary embodiment, each column of signal pairs 127 may extend within a different contact plane that is parallel to the contact plane $P_2$. Such configurations may be referred to as a vertical contact configuration. Accordingly, the mating interfaces 112, 122 have an orthogonal relationship. Likewise, the mating interfaces 112, 122 are configured to engage module connectors (not shown) that have an orthogonal relationship with respect to each other.

Although the illustrated embodiment shows the mating interfaces 112, 122 having different rotational orientations relative to each other, the mating interfaces 112, 122 can be different for other reasons. For example, the mating interfaces 112, 122 may have substantially the same rotational orientation, but the mating interfaces 112, 122 may use different types of contacts and/or have different spatial arrangements.

Embodiments described herein include conductive pathways that extend through the connector assembly 108, the circuit board 102, and the connector assembly 110. Each conductive pathway may include, among other things, one of the signal contacts 116 and an associated signal contact 126. As used herein, signal contacts are associated with each other if the two signal contacts are electrically coupled to each other along a conductive pathway to transmit data signals. Likewise, a pair of signal contacts is associated with another pair of signal contacts if the two signal contacts of one pair are electrically coupled to the two signal contacts of the other pair through respective conductive pathways. Other conductive elements (e.g., plated vias, conductive traces, ground contacts or shields) can be associated with another conductive element if the two conductive elements are electrically coupled to each other along a conductive pathway.

Conductive pathways between the mating interfaces 112, 122 are established when the connector assemblies 108, 110 are mounted and communicatively coupled to the circuit board 102. Embodiments described herein are configured to transition the conductive pathways from the mating interface 112 to the mating interface 122. In the illustrated embodiment, the connector assemblies 108, 110 are configured to effectively rotate the pairs of conductive pathways about 90° so that the module connectors (not shown) having an orthogonal relationship can be communicatively coupled by the communication system 100. However, in other embodiments, the pairs of conductive pathways can be rotated more than or less than 90°.

Figure 3:
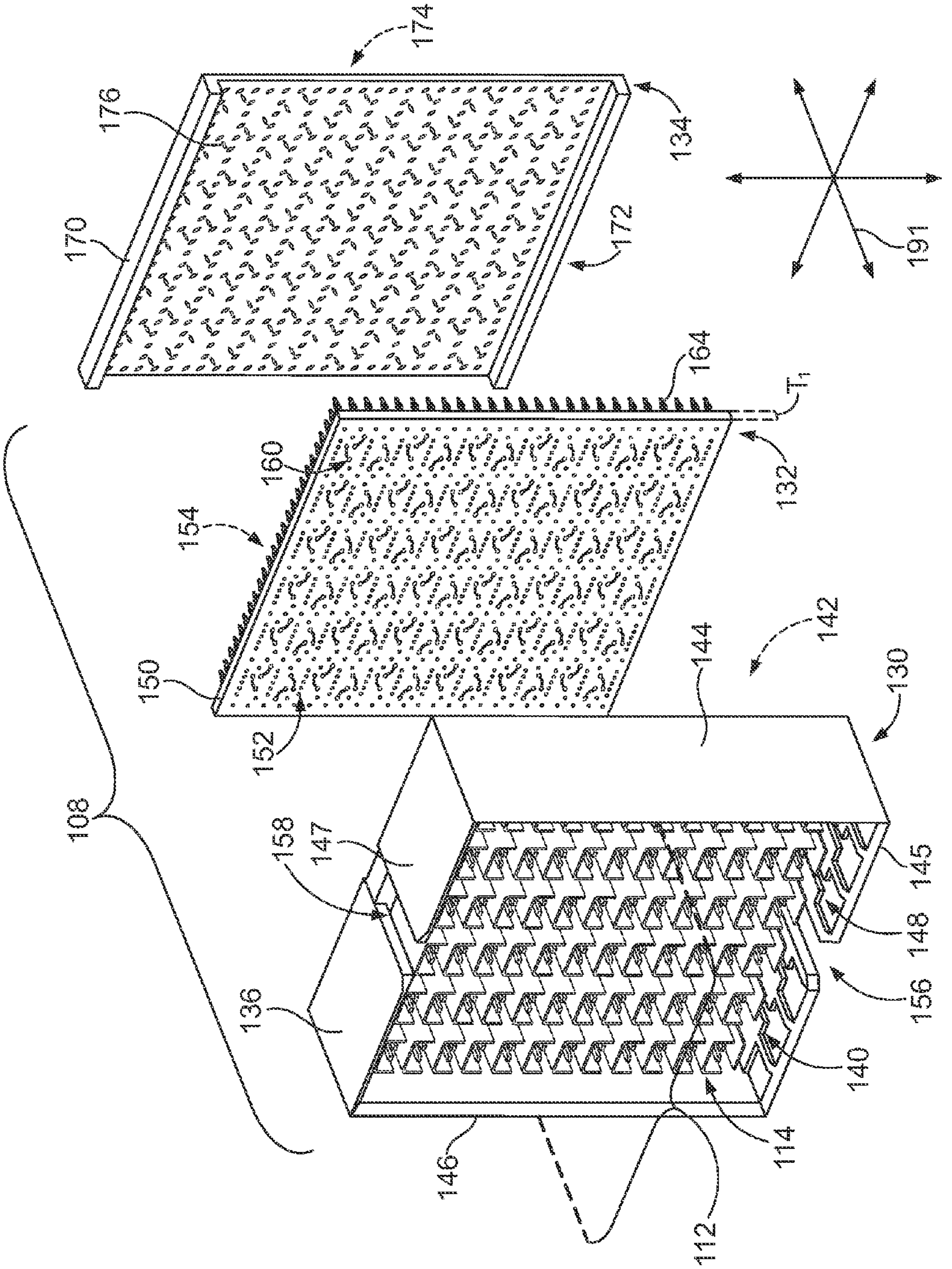
FIG. 3 is a front-perspective, exploded view of one of the connector assemblies formed in accordance with one embodiment.
Figure 4:
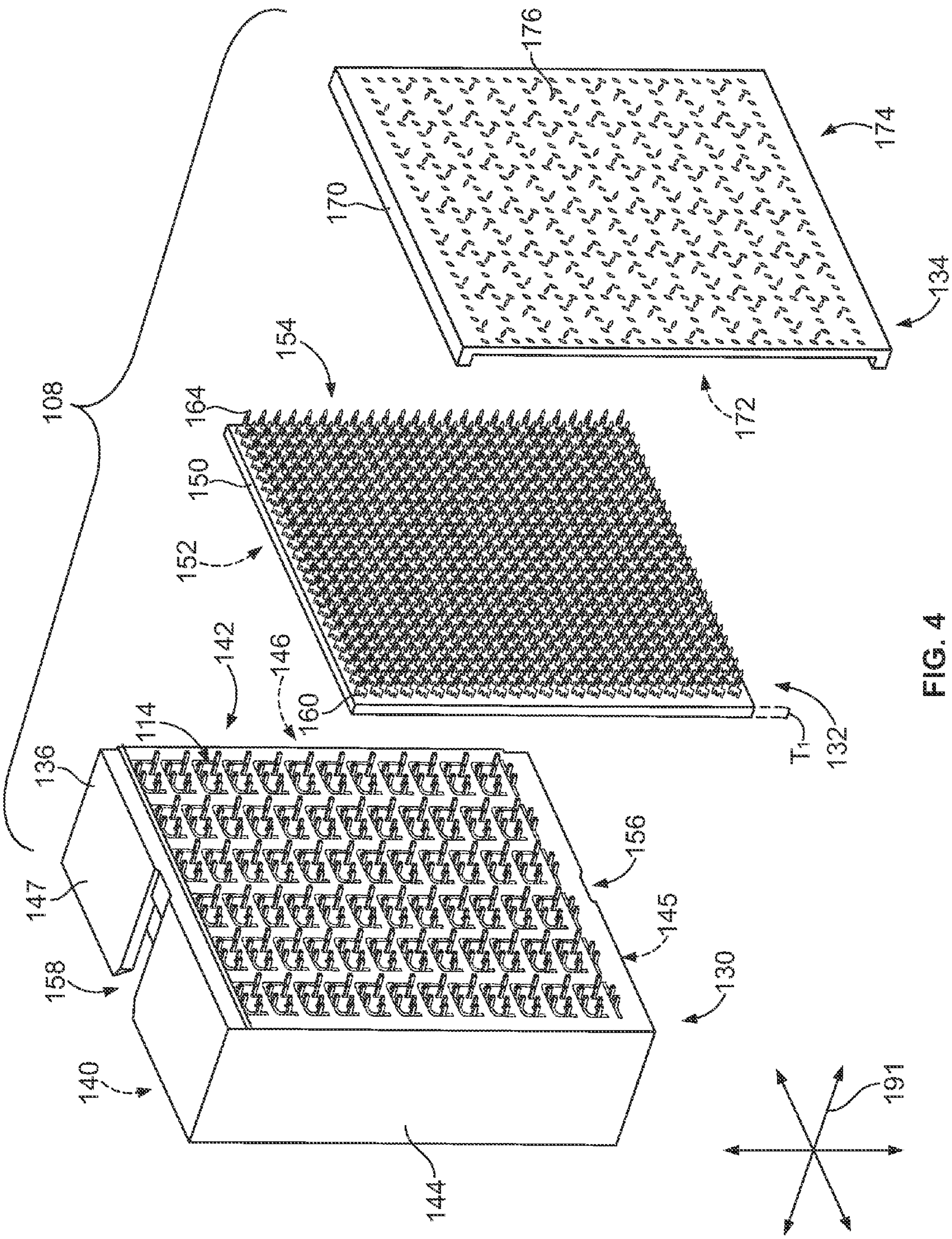
FIG. 4 is a rear-perspective view of the connector assembly shown in FIG. 3.

FIGS. 3 and 4 illustrate exploded front-perspective and rear-perspective views, respectively, of the connector assembly 108. Although the following description is with specific reference to the connector assembly 108, the connector assembly 110 (FIG. 1) may also be constructed in a similar manner. The connector assembly 108 may include an electrical connector 130, an interposer 132, and a contact organizer 134. In an exemplary embodiment, the electrical connector 130, the interposer 132, and the contact organizer 134 can be stacked side-by-side in which the interposer 132 is located between the electrical connector 130 and the contact organizer 134. The interposer 132 can be sandwiched between the electrical connector 130 and the contact organizer 134.

The electrical connector 130 includes a connector body 136 having a mating side 140 and an interior side 142. In an exemplary embodiment, the electrical connector 130 is a vertical header connector in which the electrical contacts 114 are exposed. However, in other embodiments, the electrical connector 130 may be a vertical receptacle connector in which the electrical contacts 114 are located in socket cavities. Other types of electrical connectors that transmit data signals may be suitable as well. The mating and interior sides 140, 142 face in opposite directions along the mating axis 191. The connector body 136 is configured to hold the electrical contacts 114. The mating interface 112 includes the mating side 140 and the electrical contacts 114. In the illustrated embodiment, the interior side 142 is substantially planar and the electrical contacts 114 project away from the interior side 142 and are configured to couple to the interposer 132. As shown, the connector body 136 can include a plurality of sidewalls 144-147 that define a connector-receiving space 148 (FIG. 3).

The sidewalls 145, 147 include alignment features 156, 158, respectively, that are configured to engage the module connector (not shown) during a loading operation. As shown, the alignment features 156, 158 are slots or recesses in the sidewalls 145, 147. However, the alignment features 156, 158 can be other structural elements (e.g., projections) in alternative embodiments. In an exemplary embodiment, the electrical contacts 114 project into the connector-receiving space 148 (FIG. 3) such that the electrical contacts 114 are only separated by space. However, in alternative embodiments, the connector body 136 may define socket cavities having electrical contacts located therein. In such embodiments, the electrical contacts may be separated by dielectric material that defines the socket cavities.

The interposer 132 includes a substrate 150 that has a connector side 152 and a board side 154 that face in opposite directions along the mating axis 191. The substrate 150 has a thickness $T_1$ that is defined between the connector and board sides 152, 154. For example, the thickness $T_1$ can be about 1.0 mm or less.

In some embodiments, the interposer 132 includes or constitutes a circuit board. The substrate 150 may comprise a plurality of stacked substrate layers (e.g., four layers) with conductive elements embedded or patterned thereon. In an exemplary embodiment, the interposer 132 includes plated vias 160 that are distributed throughout the substrate 150 in a predetermined pattern. The vias 160 may be thru-holes or extend only partially into the substrate 150. The vias 160 may extend into the interposer 132 from at least one of the connector or board sides 152, 154. In the illustrated embodiment, at least some of the vias 160 extend entirely through the thickness $T_1$ of the substrate 150. However, some of the vias 160 can extend partially into the interposer 132 from the connector side 152, and some of the vias 160 can extend into the interposer 132 from the board side 154. In particular embodiments, all of the vias 160 extend entirely through the substrate 150.

The connector side 152 is configured to engage or interface with the interior side 142 of the connector body 136, and the board side 154 is configured to engage or interface with the contact organizer 134. In other embodiments, the contact organizer 134 may not be used and the board side 154 is mounted to the circuit board 102 (FIG. 1). Also shown, the connector assembly 108 can include an array of the board contacts 164 that are coupled to the interposer 132 along the board side 154. The board contacts 164 are inserted into corresponding vias 160 along the board side 154 and project along the mating axis 191 toward the circuit board 102.

The contact organizer 134 includes an organizer body 170 having an interior side 172 and a mounting side 174 that face in opposite directions along the mating axis 191. The interior side 172 is configured to engage the board side 154 of the interposer 132, and the mounting side 174 is configured to engage the circuit board 102 (FIG. 1). The organizer body 170 includes an insulative or dielectric material that is molded or otherwise formed to include the features described herein. The contact organizer 134 includes a plurality of contact holes 176 that extend entirely through the organizer body 170. The contact holes 176 are sized and shaped to receive corresponding board contacts 164 and permit the board contacts 164 to project through the contact holes 176 into an exterior of the connector assembly 108. The contact holes 176 may be sized and shaped to form a snug fit or an interference fit with the board contacts 164. In such embodiments, the contact organizer 134 may provide additional support for the board contacts 164 when the connector assembly 108 is mounted to the circuit board 102.

As shown in FIGS. 3 and 4, the interposer 132 may be located between two different dielectric bodies (i.e., the connector body 136 and the contact organizer 134) that each supports corresponding contacts when the connector assembly 108 is constructed. Accordingly, the connector body 136 may be characterized as a first contact organizer and the contact organizer 134 may be a second contact organizer. In an exemplary embodiment, the electrical contacts 114 and the board contacts extend through the first and second contact organizers, respectively, and are directly coupled to corresponding vias 160 of the interposer 132.

Figure 5:
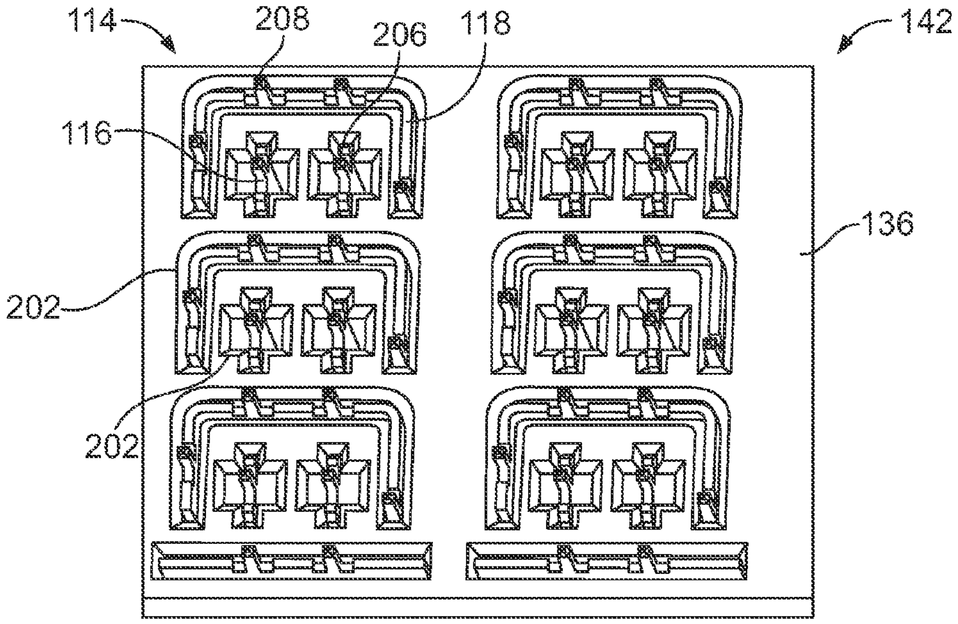
FIG. 5 illustrates a portion of an interior side of an electrical connector that may be used with the connector assembly of FIG. 3.
Figure 6:
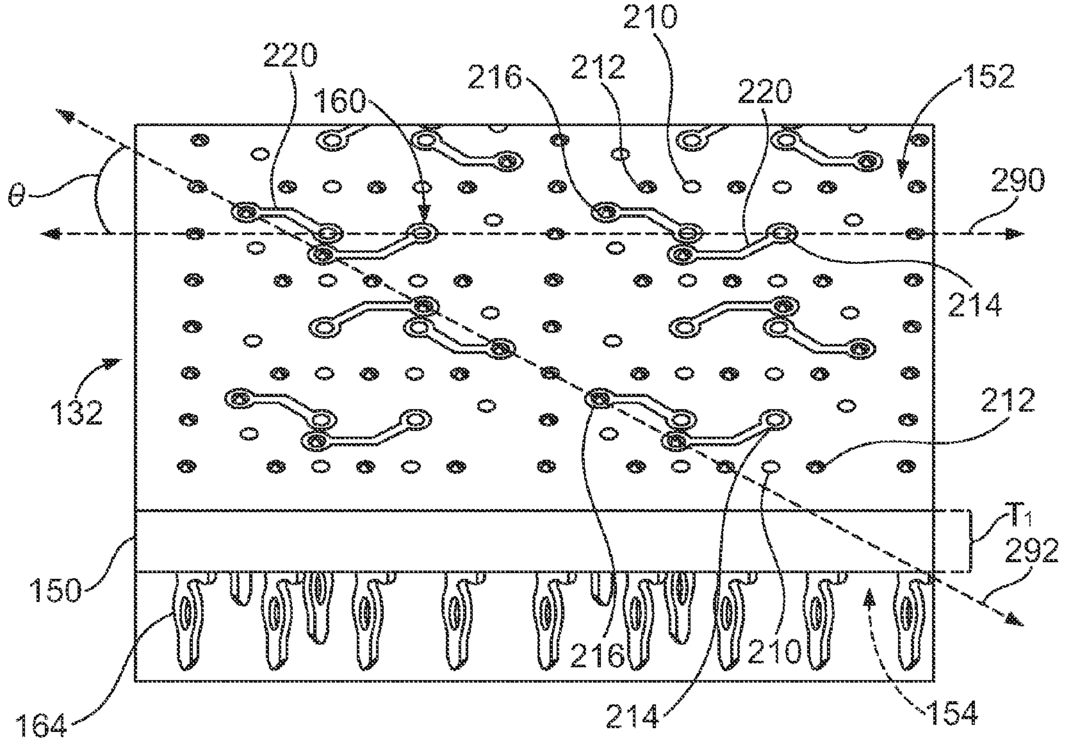
FIG. 6 illustrates a portion of a connector side of an interposer that may be used with the connector assembly of FIG. 3.
Figure 9:
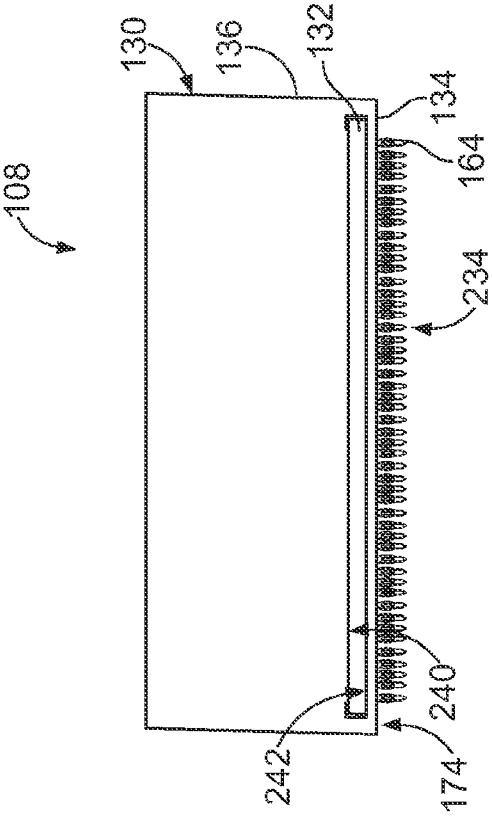
FIG. 9 is a side view of the constructed connector assembly of FIG. 3.

FIG. 5 illustrates a portion of the interior side 142, and FIG. 6 illustrates a corresponding portion of the connector side 152 that is configured to engage the interior side 142 along an interface 240 (shown in FIG. 9). With respect to FIG. 5, the connector body 136 includes a dielectric material that is molded or otherwise formed to hold the electrical contacts 114. In some embodiments, the connector body 136 may be molded separately to include contact holes or openings 202 and the electrical contacts 114 can be subsequently inserted into the contact holes 202. In other embodiments, the connector body 136 may be molded to surround the electrical contacts 114.

As shown in FIG. 5, the signal contacts 116 include contact-terminating ends 206, and the ground contacts 118 include contact-terminating ends 208. In the illustrated embodiment, the contact-terminating ends 206, 208 are pins, but may have different structures in other embodiments. For example, alternative contact-terminating ends may be compliant eye-of-needle tails or socket-shaped contacts. The contact-terminating ends 206, 208 are configured to be inserted into corresponding vias 160 (FIG. 3) of the interposer 132 (FIG. 3).

As shown in FIG. 6, the vias 160 include ground vias 210, 212, and signal vias 214, 216. The ground vias 210 are configured to receive corresponding contact-terminating ends 208 (FIG. 5) through the connector side 152, and the ground vias 212 are configured to receive corresponding board contacts 164 through the board side 154. The signal vias 214 are configured to receive corresponding contact-terminating ends 206 (FIG. 5) through the connector side 152, and the signal vias 216 are configured to receive corresponding board contacts 164 through the board side 154.

In an exemplary embodiment, the interposer 132 includes conductive traces 220 that extend between and electrically couple associated signal vias 214, 216. When the connector assembly 108 (FIG. 1) is fully assembled, the conductive traces 220 extend in a direction that is transverse to the mating axis 191 (FIG. 1). In the illustrated embodiment, the conductive traces 220 extend along a surface of the connector side 152. However, in other embodiments, the conductive traces 220 may extend within the substrate 150. For example, the conductive traces 220 may extend along an interface between adjacent substrate layers and electrically couple associated signal vias 214, 216. In particular embodiments, paths taken by the conductive traces 220 may be non-linear. Although not shown, associated ground vias 210, 212 are electrically coupled to each other through conductive traces that are similar to the conductive traces 220. In other embodiments, the ground vias 210, 212 may be electrically coupled on a separate ground plane (not shown) within the substrate 150 and also along the connector side 152. Also in other embodiments, the ground vias 210, 212 can be electrically coupled to each other on the same plane as the conductive traces 220.

FIG. 6 shows a predetermined arrangement of the ground and signal vias 210, 212, 214, 216 in an exemplary embodiment. By way of example, the signal vias 214 associated with one signal pair 117 (FIG. 1) of signal contacts 116 (FIG. 1) may be aligned with respect to an alignment axis 290, and the signal vias 216 associated with the same pair of signal contacts 116 may be aligned with an alignment axis 292. As shown in FIG. 6, the alignment axes 290, 292 intersect each other and form an angle θ. In an exemplary embodiment, the angle θ is about 45°. In some embodiments, the angle θ is at least about 45°. However, the angle θ may be more or less in other embodiments. In an exemplary embodiment, multiple pairs of the signal vias 214 can be aligned along the alignment axis 290, and multiple pairs of the signal vias 216 can be aligned along the alignment axis 292.

In the illustrated embodiment, the ground and signal vias 210, 212, 214, 216 extend entirely through the thickness $T_1$ of the interposer 132 or substrate 150. However, in alternative embodiments, the ground and signal vias 210, 212, 214, 216 may extend partially through. More specifically, the ground vias 210 and the signal vias 214 may extend into the interposer 132 from the connector side 152, and the ground vias 212 and the signal vias 216 may extend into the interposer 132 from the board side 154.

Figure 7:
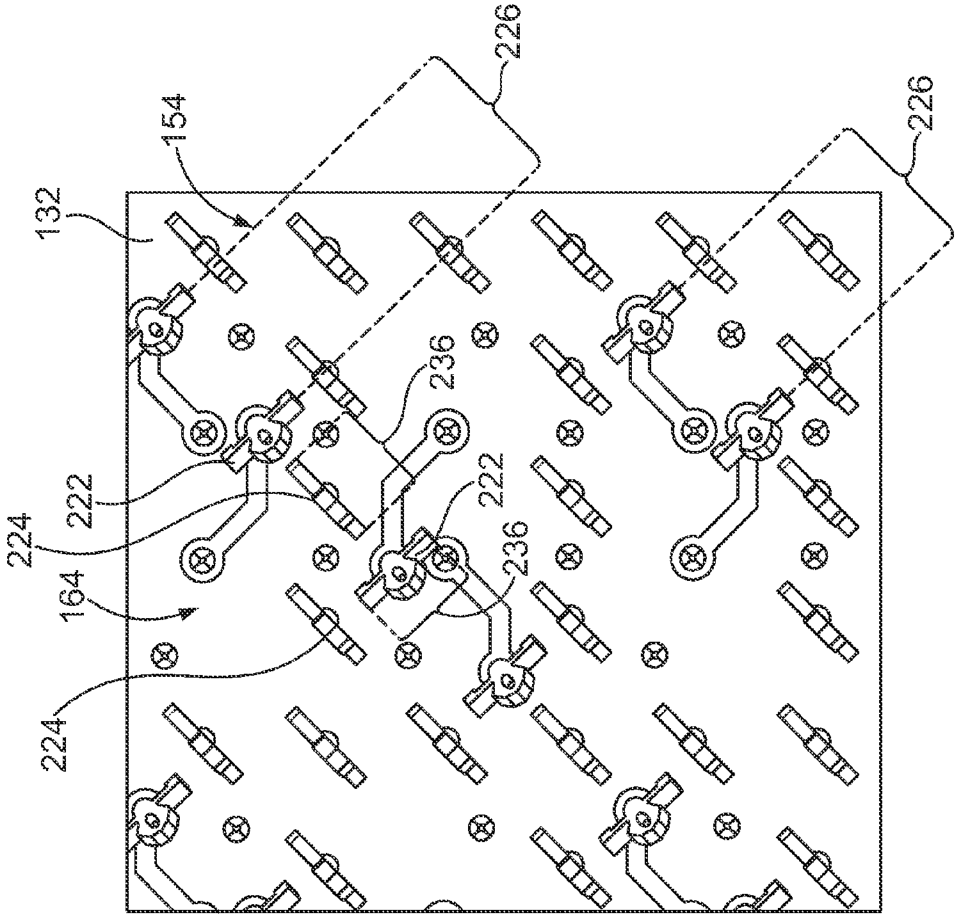
FIG. 7 illustrates a board side of the interposer having board contacts coupled thereto.

FIG. 7 illustrates the board side 154 of the interposer 132 having the board contacts 164 coupled thereto. The board contacts 164 include signal contacts 222 that are configured to transmit data signals and ground contacts 224 that are configured to facilitate shielding the signal contacts 222. The signal contacts 222 are arranged in signal pairs 226. As shown, the two signal contacts 222 of one signal pair 226 are adjacent to each other and do not have an intervening ground contact 224 therebetween. Instead, the ground contacts 224 are positioned between adjacent signal pairs 226. In the illustrated embodiment, the signal and ground contacts 222, 224 have identical structures. However, the signal and ground contacts 222, 224 may have different structures in alternative embodiments.

Figure 8:
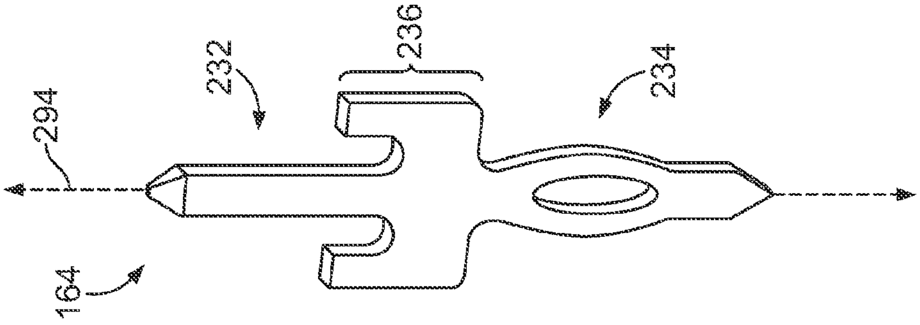
FIG. 8 is a perspective view of an exemplary board contact.

FIG. 8 is a perspective view of an exemplary board contact 164. The board contact 164 may be used as a signal contact 222 (FIG. 7) or as a ground contact 224 (FIG. 7). The board contact 164 has an elongated structure that extends along a central longitudinal axis 294. The board contact 164 is stamped from a sheet of conductive material, but the board contact 164 may also be partially shaped or formed in other embodiments. As shown, the board contact 164 includes first and second contact-terminating ends 232, 234 and a base section 236 that extends between the first and second contact-terminating ends 232, 234. In an exemplary embodiment, the first contact-terminating end 232 is a pin that is configured to be inserted into one of the vias 160 (FIG. 3), and the second contact-terminating end 234 has a compliant eye-of-needle construction that is configured to be inserted into a via (not shown) along the circuit board 102 (FIG. 1). The base section 236 is configured to provide structural integrity to the board contact 164 and support the contact-terminating ends 232, 234. In the illustrated embodiment, the base section 236 is sized and shaped to be received by one of the contact holes 176 (FIG. 3) of the contact organizer 134.

In some embodiments, the contact-terminating end 232 is soldered within one of the ground vias 160 or along one of the sides of the substrate 150 (FIG. 3). However, the contact-terminating end 232 may take other shapes than shown in FIG. 8 and may be terminated to the substrate 150 in a variety of manners. In other embodiments, the contact-terminating end 232 may be similar to the contact-terminating end 234 (e.g., eye-of-needle structure) or may have another shape that allows the contact-terminating end 232 to be press-fit.

Returning to FIG. 7, the signal contacts 222 and the ground contacts 224 may have different rotational orientations with respect to the longitudinal axis 294 (FIG. 8). In the illustrated embodiment, the base sections 236 of the signal contacts 222 and the base sections 236 of the ground contacts 224 are oriented perpendicular with respect to each other. More specifically, the signal contacts 222 are rotated about the respective longitudinal axes 294 (FIG. 8) about 90° relative to the ground contacts 224.

FIG. 9 is a side view of the fully constructed connector assembly 108. The interposer 132 and the electrical connector 130 (or the connector body 136) engage each other at an interface 240 and the interposer 132 and the contact organizer 134 engage each other at an interface 242. The interfaces 240 and 242 can be substantially planar. As shown, the board contacts 164 extend through the contact organizer 134. More specifically, the board contacts 164 extend through the contact holes 176 (FIG. 3) and project beyond the mounting side 174 so that the contact-terminating ends 234 are exposed to an exterior of the connector assembly 108.

Figure 10:
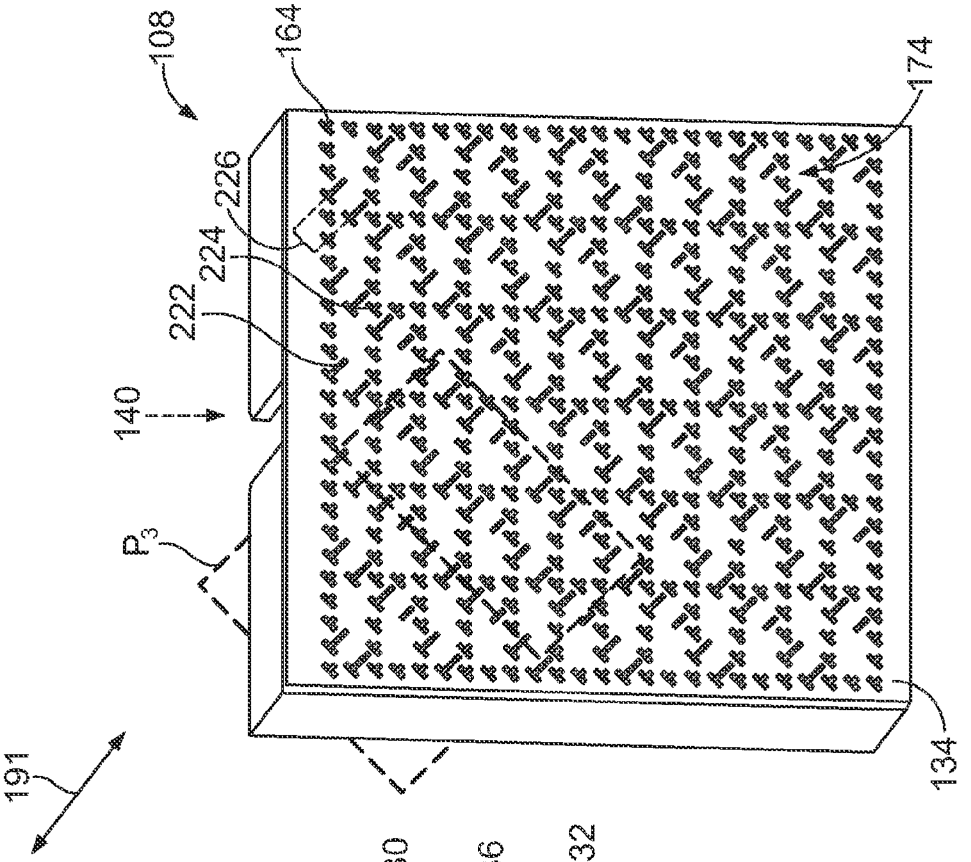
FIG. 10 is a rear view of the constructed connector assembly of FIG. 3.

FIG. 10 is a rear-perspective view of the fully constructed connector assembly 108. The board contacts 164 are arranged in a predetermined contact configuration, which may be different than the contact configuration of the electrical contacts 114 (FIG. 1). As described above, the signal contacts 116 (FIG. 1) may be arranged in rows and columns. Each row may have the same number of signal contacts 116, and each column may have the same number of signal contacts 116. However, as shown in FIG. 10, the signal contacts 222 and the signal pairs 226 are arranged in diagonals along the mounting side 174. Adjacent diagonals may have different numbers of signal contacts 222. Accordingly, the contact configuration along the mating side 140 is different from the contact configuration along the mounting side 174.

More specifically, the two signal contacts 222 of each signal pair 226 can extend substantially parallel to each other along the mating axis 191 and a contact plane $P_3$. One diagonal is indicated by dashed lines where the contact plane $P_3$ intersects the contact organizer 134. As shown, the two signal contacts 222 of each signal pair 226 are positioned within the contact plane $P_3$. The contact plane $P_3$ is not parallel to either of the contact planes $P_1$ and $P_2$ (FIG. 1) and does not coincide with either of the contact planes $P_1$ and $P_2$. Although not shown, the contact plane $P_3$ would intersect either of the contact planes $P_1$ and $P_2$ along a line that is parallel to the mating axis 191. For example, the contact planes $P_1$ and $P_3$ may intersect each other and form at least about a 45° angle.

The contact configurations along the mating side 140 and the mounting side 174 may be different in other manners other than signal pair orientation. For example, the mating side 140 includes a single ground contact 118 (FIG. 1) for each signal pair 117 (FIG. 1) whereas the mounting side 174 includes a plurality of ground contacts 224 for each signal pair 226. As another example, the ground contacts 118 are C-shaped in the illustrated embodiment and the ground contacts 224 are compliant pins configured to be inserted into corresponding vias (not shown) of the circuit board 102 (FIG. 1).

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector assembly comprising:

an electrical connector including a connector body having mating and interior sides that face in opposite directions and electrical contacts held by the connector body;

an interposer having a connector side, an opposite board side, and plated vias that extend into the interposer from at least one of the connector or board sides, the connector side engaging the interior side of the electrical connector, the electrical contacts of the electrical connector being electrically coupled to corresponding vias; and board contacts extending from the board side of the interposer and being electrically coupled to corresponding vias;

wherein the electrical contacts are configured to engage a module connector along the mating side and the board contacts are configured to engage an electrical component along the board side, the board contacts being communicatively coupled to the electrical contacts through the interposer.

2. The connector assembly of claim 1, wherein the interposer includes conductive traces that communicatively couple at least some of the electrical and board contacts.

3. The connector assembly of claim 1, wherein the vias include first vias that extend into the interposer from the connector side and second vias that extend into the interposer from the board side, the interposer including conductive traces that extend along and electrically couple associated first and second vias, the first vias being electrically coupled to the electrical contacts and the second vias being electrically coupled to the board contacts.

4. The connector assembly of claim 1, wherein the electrical contacts include signal pairs that extend along a first contact plane and the board contacts include signal pairs that extend along a second contact plane, wherein the first and second contact planes are not parallel and do not coincide with each other.

5. The connector assembly of claim 4, wherein the first and second contact planes intersect each other at an angle, the angle being about 45°.

6. The connector assembly of claim 1, wherein the electrical contacts extend through the connector body and are directly coupled to the corresponding vias and wherein the board contacts are directly coupled to the corresponding vias.

7. The connector assembly of claim 1, further comprising a contact organizer having opposite interior and mounting sides with contact holes extending therethrough, the contact organizer being coupled to the interposer with the board contacts extending through the contact holes.

8. The connector assembly of claim 1, wherein the board contacts include signal contacts that transmit data signals and ground contacts that provide electrical grounding, the board contacts including elongated structures that extend along a longitudinal axis, wherein the signal and ground contacts have different rotational orientations about the respective longitudinal axes.

9. An electrical connector assembly comprising:

an interposer including plated vias and conductive traces that communicatively couple associated vias;

a connector body and a contact organizer having the interposer located therebetween, the connector body having a mating side and the contact organizer having a mounting side, the mating and mounting sides facing away from the interposer in opposite directions along a mating axis;

electrical contacts positioned along the mating side of the connector body and communicatively coupled to the interposer; and board contacts positioned along the mounting side of the contact organizer and communicatively coupled to the interposer, wherein the board contacts are communicatively coupled to associated electrical contacts through the interposer.

10. The connector assembly of claim 8, wherein the electrical contacts have a first contact configuration along the mating side and the board contacts have a second contact configuration along the mounting side, the first and second contact configurations being different.

11. The connector assembly of claim 9, wherein the first and second contact configurations are configured to facilitate communicatively coupling two module connectors that are orthogonal to each other.

12. The connector assembly of claim 8, wherein the conductive traces communicatively couple at least some of the associated electrical and board contacts, the conductive traces extending along the interposer in directions that are transverse to the mating axis.

13. The connector assembly of claim 8, wherein the electrical contacts extend through the connector body and are directly coupled to the corresponding vias and wherein the board contacts extend through the contact organizer and are directly coupled to the corresponding vias.

14. The connector assembly of claim 8, wherein the electrical contacts include signal pairs that extend along a first contact plane and the board contacts include signal pairs that extend along a second contact plane, wherein the first and second contact planes are not parallel and do not coincide with each other.

15. The connector assembly of claim 13, wherein the first and second contact planes intersect each other at an angle, the angle being about 45°.

16. The connector assembly of claim 8, wherein the connector body includes sidewalls that define a connector-receiving space at the mating side, the mounting side of the contact organizer being substantially planar and having the board contacts projecting therefrom.

17. A communication system comprising:

a circuit board having opposite first and second board surfaces; and first and second electrical connector assemblies mounted to the first and second board surfaces, respectively, at least one of the first or second connector assemblies comprising an electrical connector and an interposer that is located between the electrical connector and the circuit board, the first and second connector assemblies having mating interfaces with electrical contacts;

wherein the mating interfaces of the first and second connector assemblies are configured to engage corresponding module connectors that have an orthogonal relationship with respect to each other.

18. The communication system of claim 17, wherein the first and second board surfaces face in opposite directions along a mating axis, the interposer including conductive traces that extend along and electrically couple associated vias, the conductive traces extending transverse to the mating axis.

19. The communication system of claim 18, wherein said at least one of the first or second connector assemblies includes board contacts, the interposer being communicatively coupled to the circuit board through the board contacts.

20. The communication system of claim 17, wherein each of the first and second connector assemblies includes an electrical connector and an interposer that is located between the respective electrical connector and the circuit board.

* * * * *